United States Patent [19]

Becke

[11] 4,137,545

[45] Jan. 30, 1979

[54] GATE TURN-OFF THYRISTOR WITH ANODE RECTIFYING CONTACT TO NON-REGENERATIVE SECTION

[75] Inventor: Hans W. Becke, Morristown, N.J.

[73] Assignee: RCA Corporation, New York, N.Y.

[21] Appl. No.: 833,751

[22] Filed: Sep. 16, 1977

[30] Foreign Application Priority Data

Jan. 31, 1977 [GB] United Kingdom ............... 03918/77

[51] Int. Cl.² ......................................... H01L 29/747
[52] U.S. Cl. ......................................... 357/39; 357/15; 357/38; 357/36; 357/46
[58] Field of Search ....................... 357/38, 15, 39, 36, 357/46

[56] References Cited

U.S. PATENT DOCUMENTS

| 3,239,728 | 3/1966 | Aldrich et al. | 357/38 |
| 3,504,242 | 3/1970 | Wollex | 357/38 |
| 3,590,339 | 6/1971 | Bilo et al. | 357/38 |
| 3,725,752 | 4/1973 | Garrett | 357/38 |
| 4,054,893 | 10/1977 | Hutson | 357/15 |

FOREIGN PATENT DOCUMENTS 942901 11/1963 United Kingdom ............... 357/38

*Primary Examiner*—Joseph E. Clawson, Jr.
*Attorney, Agent, or Firm*—H. Christoffersen; R. A. Hays; R. Ochis

[57] ABSTRACT

A gate controlled semiconductor controlled rectifier comprises an integral combination of a regenerative thyristor section and an adjacent non-regenerative section. The non-regenerative section includes rectifying contact means to reduce the lateral current needed to turn on the regenerative section.

6 Claims, 2 Drawing Figures

GATE TURN-OFF THYRISTOR WITH ANODE RECTIFYING CONTACT TO NON-REGENERATIVE SECTION

This invention generally relates to semiconductor thyristor devices and, in particular, relates to gate-turn-off silicon controlled rectifiers.

Typical silicon controlled rectifiers (hereinafter designated as SCR's) are comprised of four layer-like regions of alternating conductivity, i.e., NPNP or PNPN. The four regions are often known as a cathode region, an active gate region, a base region and an anode region. Due to the alternating conductivity types of the four layer-like regions, SCR's are occasionally characterized as devices having three PN junctions. SCR's can be further characterized as devices which have a high impedance, or blocking, state and a low impedance, or conducting, state. Such devices can usually be switched from the high impedance state to the low impedance state, for example, by a positive voltage pulse, i.e., for an NPNP configuration, applied to the active gate region. SCR's which can be switched from the low impedance state to the high impedance state by an oppositely polarized pulse are conventionally known as gate-turn-off (hereinafter designated as GTO) devices.

A typical GTO device comprises a regenerative SCR section with a non-regenerative section adjacent thereto. Usually, the non-regenerative region is distal from where the switching pulse is injected into the device. In these devices, when the non-regenerative region is comprised of three layer-like regions, the gate current required to switch the SCR in the usual fashion, i.e., from the high impedance state to the low impedance state, is usually quite large. This is because a substantial part of the turn-on current which flows from the cathode toward the base region flows out of the device through the non-regenerative section and does not accumulate in the base region to overcome the forward conduction voltage of the PN junction between the anode region and the base region. Thus, in order to initiate regeneration, and hence switching, the lateral currents through the base region adjacent the anode region/base region PN junction must be large enough to create a resistive type voltage drop equal to or greater than the forward conduction voltage of this PN junction.

A device embodying the principles of the present invention comprises a voltage barrier in the non-regenerative section and thus reduces the amount of lateral current needed to overcome the forward conduction voltage of the anode region/base region PN junction.

Figure 1:
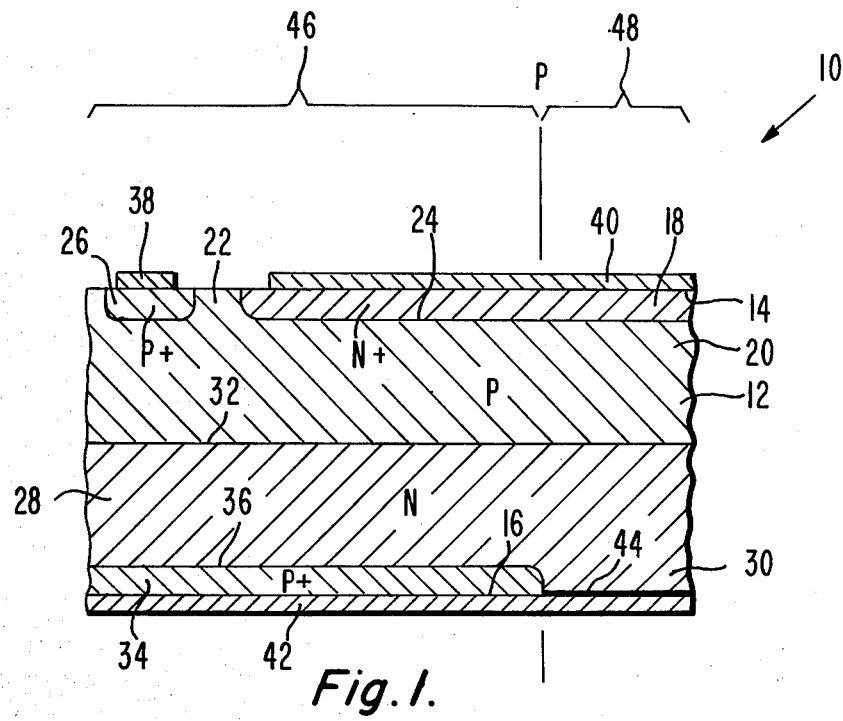
FIG. 1 is a cross-sectional view of a device, not drawn to scale, embodying the principles of the present invention.

A device, indicated generally at 10 in FIG. 1, which embodies the principles of the present invention comprises a body 12 of semiconductor material, preferably silicon, having first and second major opposing surfaces, 14 and 16 respectively.

A first region 18 having a one type conductivity, for example N type, is adjacent the first major surface 14. Although the first region 18 has been designated as having an N type conductivity it could also be fabricated as a P type region so long as all other conductivity types mentioned are likewise changed.

A second region 20 having another type conductivity, in this example P type, is adjacent the first region 18 and has a portion 22 thereof extending to the first major surface 14. Preferably, the second region 20 extends laterally beneath substantially all of the second region 18. A first PN junction 24 is formed at the interface between the first region 18 and the second region 20. The portion 22 contains a pocket 26 having the same conductivity type as the second region 20 but having a comparatively higher surface carrier concentration.

A third region 28 having the one type conductivity is adjacent the second region 20 and spaced apart from the first region 18 thereby. The third region 28 has a portion 30 thereof extending to the second major surface 16, the portion 30 being distal, or remote, from the pocket 26 of the second region 20. A second PN junction 32 exists at the interface between the second region 20 and the third region 28.

A fourth region 34 having the other type conductivity is adjacent the second major surface 16 and forms a third PN junction 36 with the third region 28. The fourth region 34 is positioned such that it is vertically aligned with a substantial part of the portion 22 of the first region 20 and also laterally overlaps the first region 18. That is, the fourth region 34 should be vertically aligned with a part of the first region 18.

A first electrode 38 overlies and ohmically contacts the pocket 26 of the second region 20.

A second electrode 40 overlies and ohmically controls the first region 18. The second electrode 40 at least vertically overlies substantially all of the portion 30 of the third region 28 which extends to the second major surface 16 as well as substantially all of the vertically overlapped fourth region 34.

A third electrode 42 overlies and contacts the second major surface 16. The third electrode 42 is such that it ohmically contacts the fourth region 34 adjacent the second major surface 16 and rectifyingly contacts the portion 30 of the third region 28 extending to the second major surface 16. Preferably, the third electrode 42, for example, forms a Schottky barrier diode 44 with the portion 30 of the third region 28 which has a forward conduction voltage about equal to that of the forward conduction voltage of the third PN junction 36.

For the sake of clarity in the following description of a more detailed example of the device 10, the device 10 is considered as having a regenerative SCR section 46 which is to the left of an imaginary plane P passing through the body 12 in a substantially vertical fashion. The plane P is considered to pass through the interface between the fourth region 34 and the portion 30 of the third region 28. The part of the body 12 to the right of the plane P is a non-regenerative section 48.

The first region 18 preferably has an uncompensated surface carrier concentration on the order of about $5 \times 10^{20}$ atoms/cm$^3$. The part of the first region 18 which is contained in the regenerative section 46 functionally operates as a cathode region.

The second region 20 preferably has an uncompensated surface carrier concentration on the order of about $10^{16}$ atoms/cm$^3$ while the pocket 26, which is distal from the plane P, preferably has an uncompensated surface carrier concentration on the order of about $10^{20}$ atoms/cm$^3$. The part of the second region 20 to the left of the plane P functionally operates as an active gate region while the pocket 26 is generally known as a gate contact region. It will be understood that if the gate contact region is central to an annular shaped device structure the non-regenerative section 48 preferably surrounds the regenerative SCR section 46. The third region 28 preferably has an uncompensated average carrier concentration on the order of about $10^{14}$ atoms/cm$^3$. That amount of the third region 28 in the regenerative SCR section 46 functions as a base region thereof.

The fourth region 34 preferably has an uncompensated surface carrier concentration on the order of about $10^{20}$ atoms/cm$^3$ and is completely in the regenerative SCR section 46. The fourth region 34 functions as an anode region.

The non-regenerative section 48 comprises the parts of the first, second and third regions, 18, 26 and 28, respectively, which extend to the right of the plane P. The non-regenerative section 48 also comprises the Schottky barrier diode 44.

The device 10 can be fabricated by using techniques known in the art, for example diffusion processes. Preferably, the Schottky barrier diode 44 is formed by first forming the third electrode 42, by the electroless plating of nickel, although other metals may also be used, on the second surface 16 and then sintering the nickel at about 580° C. for about 30 minutes. This procedure results in the nickel ohmically contacting the fourth region 34 and rectifyingly contacting the portion 30 of the third region 28. For the example given above, this procedure results in a Schottky barrier diode 44 having a forward voltage on the order of about 0.7 volts and a reverse blocking voltage, which is a function of the carrier concentration of the portion 30, on the order of several hundred volts. It will be understood, however, that by varying the time and temperature of the sintering step, Schottky diodes with differing voltage characteristics can be formed.

Since the general operation of an GTO/SCR is well known only those operational features affected by the principles of the present invention are hereinafter described in detail.

The first feature considered is the switching of the device 10 from a high impedance, or blocking, state to a low impedance, or conducting, state. For an NPNP device, the cathode region can be considered to be at ground potential and the anode region would then be biased with a positive potential. In this condition the first and third PN junctions, 24 and 36 respectively, are forward biased and the second PN junction 32 is reverse biased. When a positive, with respect to ground, potential is applied to the second, or active gate, region 20 via the pocket 26 for example, holes, i.e., positive carriers, are injected into the second region 20 and accumulate near the first PN junction 24. When this accumulation is sufficient to overcome the forward conduction voltage of the first PN junction 24, usually equal to about 0.7 volts, electrons are injected into the second region 20 from the first region 18. These electrons drift across the second PN junction 32 and, but for the presence of the Schottky barrier diode 44, would be pulled out of the device 10, via the portion 30 of the third region 28, by the positive potential on the third electrode 42. In such a case, i.e., were the diode 44 not present, the electron current in the third region 28, in order to overcome the forward conduction voltage of the third PN junction 36 and institute regeneration, would have to be sufficiently large in the lateral direction that a resistive voltage drop equal to the forward conduction voltage of the third PN junction 36, about equal to 0.7 volts, would be generated. In order to accomplish this, the hole current initially injected into the second region 20 would then have to be correspondingly larger.

However, due to the presence of the Schottky diode 44, assuming that its potential barrier is about 0.7 volts, little or no electrons are lost, via the portion 30, through the third electrode 42. Therefore, the electrons accumulate more quickly to overcome the forward conduction voltage of the third PN junction 36 and little or no lateral voltage drop is needed to institute regeneration. It should be understood that even if the potential barrier of the diode 44 is considerably less than the forward conduction voltage of the third PN junction 36, the lateral current necessary for initiating current regeneration is nevertheless reduced. The amount of lateral current needed thus being inversely related to the potential barrier of the diode 44.

During the turn-off operation, i.e., when a negative potential is applied to the first electrode 38, the conducting plasma is repelled from the regenerative SCR section 46 into the three-layer non-regenerative section 48 since it is most remote from the pocket 26. The conducting plasma "sees" the third PN junction 36 and the Schottky diode 44 as about equal potential barriers and, since it is a shorter path, flows across the diode 44 and out of the device 10 via the third electrode 42 thereby eliminating the regeneration of holes and extinguishing the plasma.

Another operational feature affected by the utilization of the principles of the present invention is the reverse blocking capability of the device 10. Under reverse bias conditions, that is where the second electrode 40 is more positively biased than the third electrode 42, but for the presence of the Schottky diode 44, the blocking voltage of the device 10 is almost totally dependent on the reverse blocking capability of the first PN junction 24. However, by the presence of the diode 44, the blocking capability is improved by the reverse bias capability of that diode 44, which is on the order of about several hundred volts.

Figure 2:
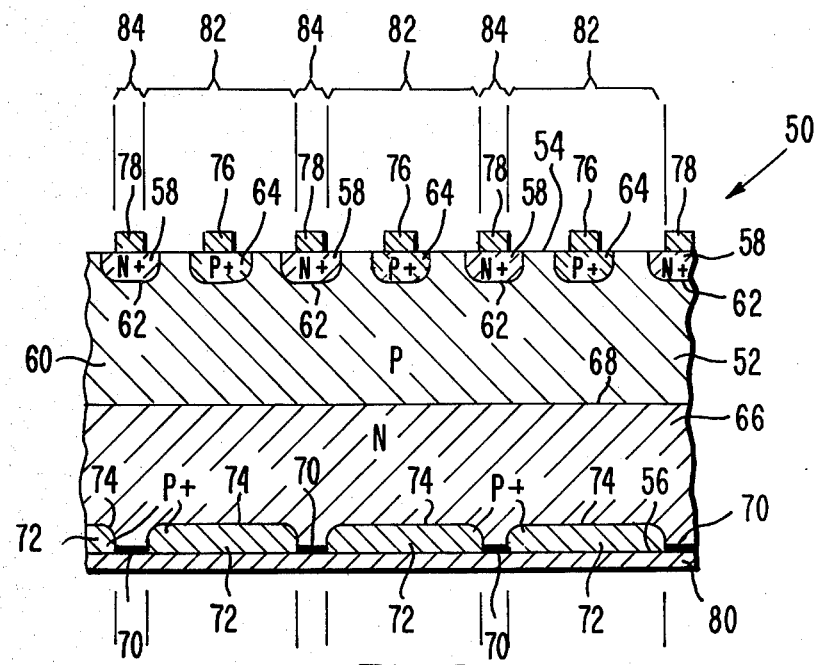
FIG. 2 is a cross-sectional view of another device, not drawn to scale, embodying the principles of the present invention.

Another device, indicated generally at 50 in FIG. 2 of the drawing, also comprises a body 52 of semiconductor material having first and second major opposing surfaces 54 and 56, respectively.

The device 50 comprises a plurality of first regions 58 having a one type conductivity adjacent the first surface 54 and a second region 60 having another type conductivity adjacent the first regions 58 and forming a plurality of first PN junctions 62 therewith. There is a plurality of pockets 64 within the second region 60 having the other type conductivity but having a comparatively higher carrier concentration. Preferably, the pockets 64 extend to the first surface 54 and are intermixed among the first region 58 but spaced apart therefrom by material of the second region 60. The pockets 64 may, of course, have finger-like surface intercepts and be interdigitated with similarly shaped first regions 58.

A third region 66 having the one type conductivity is adjacent the second region 60 and forms a second PN junction 68 at the interface therewith. Portions 70 of the third region 66 extend to the second major surface 56. Preferably, each portion 70 is vertically aligned with a portion of a first region 58.

A plurality of fourth regions 72 are adjacent the second major surface 56 and form a plurality of third PN junctions 74 at these interfaces with the third region 66. Preferably, each fourth region 72 is vertically aligned with at least one pocket 64 and laterally overlaps at least one first region 58.

First electrode means 76 electrically contacts each of the pockets 64 and second electrode means 78 contact each of the first regions 58 overlying the respective portions 70 of the third region 66. Third electrode means 80 overlies and contacts the second major surface 56 in a manner such that ohmic contact is made to the fourth region 72 and rectifying contact is made to the portions 70 of the third region 66.

The device 50 has a plurality of regenerative SCR sections 82 which are those sections vertically aligned with the plurality of fourth regions 72, and a plurality of non-regenerative sections 84, which are sections vertically aligned with the portion 70 of the third region 66.

The operational advantage of the device 50, when compared to the device 10, is that the distance which the conducting plasma must be repelled to reach a non-regenerative section 84 is reduced. That is, for devices of equal area, the total regenerative SCR section 46 of the device 10 is divided into the plurality of smaller regenerative SCR section 82 of the device 50, each having a non-regenerative section 84 adjacent thereto. Thus, the distance the plasma must be repelled in the device 50 to reach a non-regenerative section 84 is comparatively reduced and is dependent upon the number of regenerative and non-regenerative sections, 82 and 84 respectively, within the device 50. In fact, devices embodying the principles of the present invention allow such subdivision that the turn-off time of the device approaches the theoretical limit of the ideal one-dimensional filament device.

Devices embodying the principles of the present invention, therefore, provide gate-turn-off capability without substantially increasing the gate current necessary for turn-on, with little or no reduction in the reverse blocking capability of the device.

What is claimed is:

1. A gate controlled semiconductor device comprising:
    a body of semiconductor material having therein a four layer regenerative controlled rectifier section and a three layer non-regenerative section,
    said four layers of said regenerative section having alternating conductivity types, and comprising a cathode region adjacent a first major surface of said body and having a one type conductivity, an active gate region having a second type conductivity, a base region having said one type conductivity, said base region being spaced apart from said cathode region by said active gate region, and an anode region having said second type conductivity and being adjacent to a second major surface of said body and spaced apart from said cathode region by said gate region and said base region, a portion of said anode region overlapping said cathode region;
    said non-regenerative section being adjacent to and integral with said regenerative section, said three layers of said non-regenerative section comprising extensions of said cathode region, said active gate region and said base region, a portion of said base region extending to said second major surface in said non-regenerative section; and
    means for rectifyingly contacting said portion of said base region at said second major surface to reduce the lateral current between said regenerative section and said non-regenerative section necessary to initiate current regeneration in said regenerative controlled rectifier section.

2. A gate controlled semiconductor device as claimed in claim 1 wherein:
    said means for rectifyingly contacting said portion of said base region is a Schottky barrier diode.

3. A gate controlled semiconductor device as claimed in claim 1 wherein:
    a PN junction exists between said anode region and said base region, said PN junction having a forward conduction voltage; and
    said rectifying contact means has a barrier voltage about equal to said forward conduction voltage.

4. A gate controlled semiconductor device as claimed in claim 1 wherein:
    a portion of said active gate region extends to said first major surface; and
    a pocket having said second type conductivity is within said portion of said active gate region and has a comparatively higher carrier concentration than the remainder of said active gate region, said pocket being distal from said non-regenerative section.

5. A gate controlled semiconductor device as claimed in claim 1 wherein:
    said regenerative controlled rectifier section comprises a plurality of cathode regions, a plurality of anode regions and a plurality of rectifying contact means; each said rectifying contact means being positioned where a line through it which is perpendicular to the plane of a major surface of said body also passes through one of said cathode regions.

6. A gate controlled semiconductor device as claimed in claim 5 wherein:
    portions of said active gate region extend to said first major surface; and
    a plurality of pockets having said second type conductivity are within said portions of said active gate region and have a comparatively higher carrier concentration than the remainder of said active gate region, said pockets being distal from each said rectifying contact means.

* * * * *